(12) United States Patent
Shigetaka

(10) Patent No.: US 11,904,455 B2
(45) Date of Patent: Feb. 20, 2024

(54) PROXIMITY DETECTION SYSTEM

(71) Applicant: ALPS ALPINE CO., LTD., Tokyo (JP)

(72) Inventor: Hiroshi Shigetaka, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 361 days.

(21) Appl. No.: 17/189,688

(22) Filed: Mar. 2, 2021

(65) Prior Publication Data

US 2021/0178605 A1 Jun. 17, 2021

Related U.S. Application Data

(63) Continuation of application No. PCT/JP2019/008894, filed on Mar. 6, 2019.

(30) Foreign Application Priority Data

Sep. 14, 2018 (JP) .................. 2018-172510

(51) Int. Cl.
*B25J 19/02* (2006.01)
*G01V 3/08* (2006.01)
*B25J 13/08* (2006.01)
*H03K 17/955* (2006.01)

(52) U.S. Cl.
CPC .......... *B25J 13/086* (2013.01); *H03K 17/955* (2013.01); *H03K 2217/960765* (2013.01)

(58) Field of Classification Search
CPC ........ B25J 13/086; B25J 19/027; B25J 19/06; B25J 9/00; B25J 9/1612; B25J 9/1669; B25J 9/1674; H03K 17/955; H03K 2217/960765; H03K 2217/960705; G01V 3/08; G05B 2219/37277;
(Continued)

(56) References Cited

U.S. PATENT DOCUMENTS

| 5,166,679 A | 11/1992 | Vranish et al. |
| 2007/0269012 A1* | 11/2007 | Somers .................. A61B 6/102 |
| | | 378/117 |

(Continued)

FOREIGN PATENT DOCUMENTS

| DE | 10064507 A1 * | 7/2002 | ......... H03K 17/9505 |
| DE | 102014014050 A1 * | 3/2016 | ............ B25J 13/086 |
| JP | S63-238502 | 10/1988 | |

(Continued)

OTHER PUBLICATIONS

Sweetwater, "What is Unity Gain and Why Should I Care?", Jul. 24, 2014 (Year: 2014).*

(Continued)

*Primary Examiner* — Adam R Mott
*Assistant Examiner* — Byron Xavier Kasper
(74) *Attorney, Agent, or Firm* — IPUSA, PLLC

(57) ABSTRACT

A proximity detection system includes a proximity sensor that is a capacitive sensor mounted on a mounting position on a robot, the proximity sensor being configured to detect proximity between the mounting position and an object; and a shield signal output unit configured to apply a shield signal for preventing the proximity sensor from detecting proximity of another position of the robot other than the mounting position.

4 Claims, 5 Drawing Sheets

(58) Field of Classification Search
CPC ........... G05B 2219/37279; G05B 2219/40455; G05B 2219/40544
See application file for complete search history.

(56) References Cited

U.S. PATENT DOCUMENTS

2008/0122458 A1* 5/2008 Lenz .................... H03K 17/955
  324/687
2021/0080293 A1* 3/2021 Roziere .............. G05B 19/4061

FOREIGN PATENT DOCUMENTS

| JP | H07-049711 | 2/1995 |
| JP | 2010-010116 | 1/2010 |
| JP | 2012-245575 | 12/2012 |
| WO | 2018/116706 | 6/2018 |

OTHER PUBLICATIONS

International Search Report for PCT/JP2019/008894 dated May 28, 2019.
Extended European Search Report for 19860247.6 dated May 3, 2022.

* cited by examiner

PROXIMITY DETECTION SYSTEM

CROSS-REFERENCE TO RELATED APPLICATION

The present application is a continuation application of International Application No. PCT/JP2019/008894 filed on Mar. 6, 2019, which is based on and claims priority to Japanese Patent Application No. 2018-172510 filed on Sep. 14, 2018. The contents of these applications are incorporated herein by reference in their entirety.

BACKGROUND OF THE INVENTION

1. Field of the Invention

The present invention relates to a proximity detection system.

2. Description of the Related Art

Conventionally, proximity sensors that are capable of detecting the proximity of an object according to a change in the capacitance occurring between the object and the sensor, have been known. For example, Patent Document 1 discloses a technology in which electrodes are provided on both sides of a sheet-like pressure-sensitive conductive rubber so that contact pressure can be measured, and a sensor is capable of detecting the proximity of an object by measuring the ground capacitance of the surface-side electrode. By disposing this sensor to a manipulator of a robot, it is possible to detect the proximity of the manipulator to another object such as an obstacle.

[Patent Document 1] Japanese Laid-open Patent Publication No. S63-238502

SUMMARY OF THE INVENTION

According to one aspect of the present invention, there is provided a proximity detection system including a proximity sensor that is a capacitive sensor mounted on a mounting position on a robot, the proximity sensor being configured to detect proximity between the mounting position and an object; and a shield signal output unit configured to apply a shield signal for preventing the proximity sensor from detecting proximity of another position of the robot other than the mounting position.

DETAILED DESCRIPTION OF THE PREFERRED EMBODIMENTS

In the conventional technology, for example, when a proximity sensor is provided to a robot to detect the proximity of the robot to an obstacle such as a person, when another portion of the robot is brought into proximity to the portion of the robot provided with the sensor, there is a risk that it is mistakenly detected that the robot is brought into proximity to an obstacle such as a person, and the robot may be stopped immediately. Accordingly, there is a need for a technology that can increase the accuracy in the detection of an obstacle in proximity to a robot, by preventing another portion of the robot, which may come in proximity with the portion where the sensor is provided, from being mistakenly detected as an obstacle.

One Embodiment

Hereinafter, one embodiment will be described with reference to the drawings.

(System Configuration of a Proximity Detection System 10)

Figure 1:
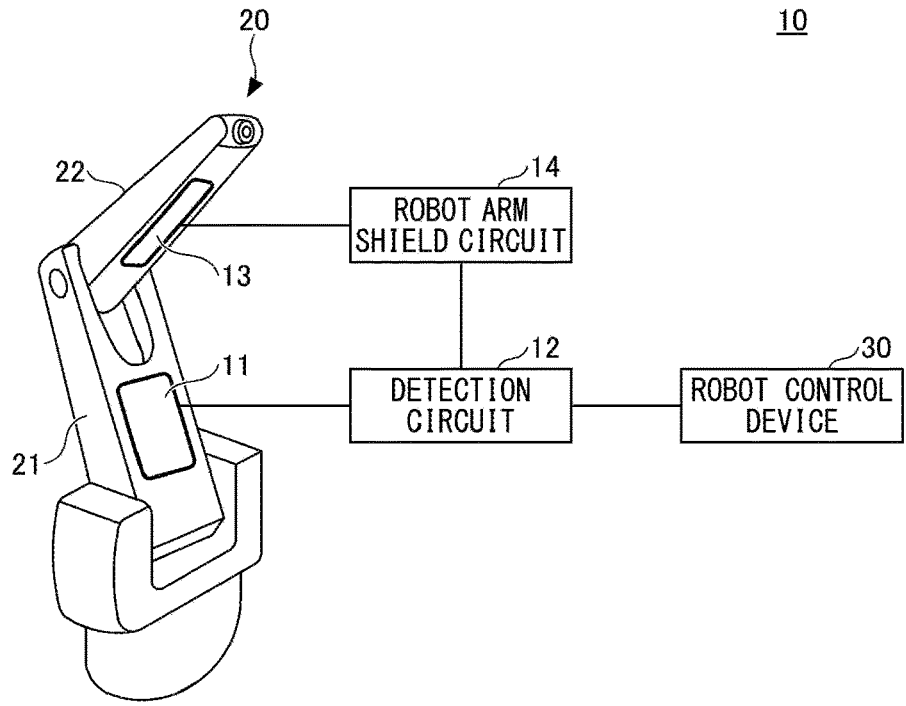
FIG. 1 is a diagram illustrating a system configuration of a proximity detection system according to an embodiment.

FIG. 1 is a diagram illustrating a system configuration of the proximity detection system 10 according to an embodiment. The proximity detection system 10 illustrated in FIG. 1 is a system for detecting the proximity of a robot 20 to a person such as a worker and outputting the detection result to a robot control device 30. As illustrated in FIG. 1, the proximity detection system 10 includes a proximity sensor 11, a detection circuit 12, a shield electrode 13, and a robot arm shield circuit 14.

The proximity sensor 11 is a capacitive proximity sensor. The proximity sensor 11 is mounted at any position of the robot 20, and detects the proximity of the robot 20 to an object. In the example illustrated in FIG. 1, the proximity sensor 11 is mounted on a first robot arm 21 of the robot 20 and detects proximity of an object associated with the motion of the first robot arm 21.

The detection circuit 12 detects the proximity between the first robot arm 21 and an object by detecting a change in capacitance at the proximity sensor 11. Specifically, the detection circuit 12 drives the proximity sensor 11 by applying an a sine-wave shaped AC voltage to the proximity sensor 11. Incidentally, an object such as a person can be regarded as a conductor and can be regarded as being connected to the ground. Therefore, according to the proximity state between the first robot arm 21 and an object, at the proximity sensor 11, the capacitance between the proximity sensor 11 and the object changes and the current value of the current flowing through the proximity sensor 11 changes. The detection circuit 12 can detect the proximity between the first robot arm 21 and an object based on the amount of change in the current flowing through the proximity sensor 11. For example, when a difference value of a capacitance at the proximity sensor 11 (that is, a difference value of the current flowing through the proximity sensor 11 from a reference value, by using, as the reference value, the current value when an object such as a human body is not present in the surrounding area) exceeds a predetermined upper limit threshold value th1, the detection circuit 12 detects that an object is in proximity to the first robot arm 21. Note that the upper limit threshold value th1 is set by obtaining an actual measurement value by changing the distance between the proximity sensor and an object (conductor), and setting the upper limit threshold value th1 based on the measurement value. The detection circuit 12 outputs a detection result of the capacitance (i.e., a value representing a change in the capacitance) to the robot control device 30 which controls the motion of the robot 20. Alternatively, the detection circuit 12 may determine the proximity state with respect to an obstacle based on the detection result of capacitance, and output the determination result to the robot control device 30. For example, when it is determined that "an object has come in proximity with the first robot arm 21" based on the detection result or the determination result output from the detection circuit 12, the robot control device 30 performs predetermined control to be performed when the robot 20 is in close proximity to an obstacle, such as immediately stopping the operation of the robot 20.

In the present embodiment, the shield electrode 13 is provided on a movable portion of the robot 20. Specifically, the shield electrode 13 is provided on a movable portion of the robot 20, which is a portion that may be mistakenly detected by the proximity sensor 11. In the example illustrated in FIG. 1, the shield electrode 13 is mounted on a second robot arm 22 of the robot 20. The second robot arm 22 is rotatably connected to the first robot arm 21 and is movable with respect to the first robot arm 21. The second robot arm 22 may be mistakenly detected as an obstacle proximate to the first robot arm 21 during a series of motions of the robot. The shield electrode 13 is disposed at a position where the first robot arm and the second robot arm face each other when the first robot arm and the second robot arm are brought into proximity to each other.

The robot arm shield circuit 14 is an example of a "shield signal output unit". The robot arm shield circuit 14 applies, to the shield electrode 13 provided on the second robot arm 22, a shield signal that can cause the detection of the proximity of an object by the proximity sensor 11 to be non-detection, that is, preventing the proximity sensor 11 from detecting the proximity of an object (i.e., such that there will be almost no change in the capacitance at the proximity sensor 11). That is, when an object, such as a human body, which can be considered as a ground, comes in proximity with the proximity sensor 11 as described above, the capacitance value between the proximity sensor 11 and the object changes so that the current flowing to the proximity sensor 11 changes. However, by attaching the shield electrode 13 to the object so that the shield electrode 13 is interposed between the object and the proximity sensor 11, and by applying a driving signal to the shield electrode 13 as described below, even when the object comes in proximity with the proximity sensor 11, the proximity sensor 11 is not affected by the object that is a ground so that the change in the current value of the current flowing to the proximity sensor 11 is reduced or eliminated. Therefore, the proximity sensor 11 does not detect proximity with the object. That is, even when the second robot arm 22 comes in proximity with the first robot arm 21, the robot arm shield circuit 14 can prevent the second robot arm 22 from being mistakenly detected as an obstacle.

(Configuration of the Proximity Sensor 11)

Figure 2:
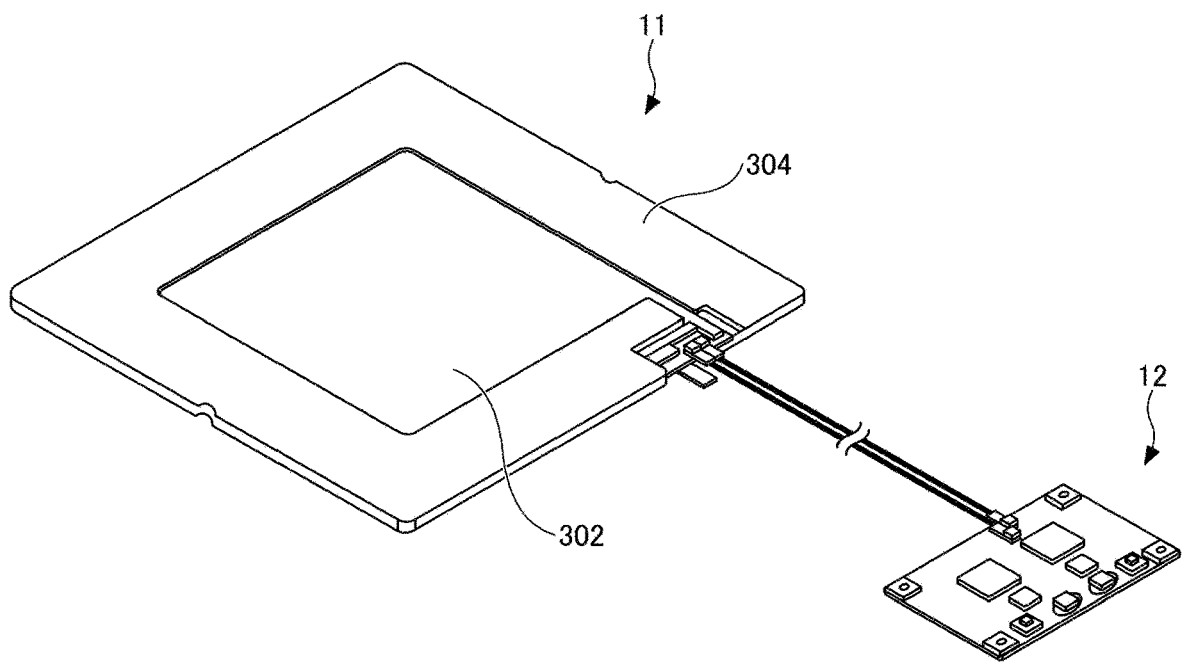
FIG. 2 is an external perspective view of a proximity sensor and a detection circuit according to an embodiment.
Figure 3:
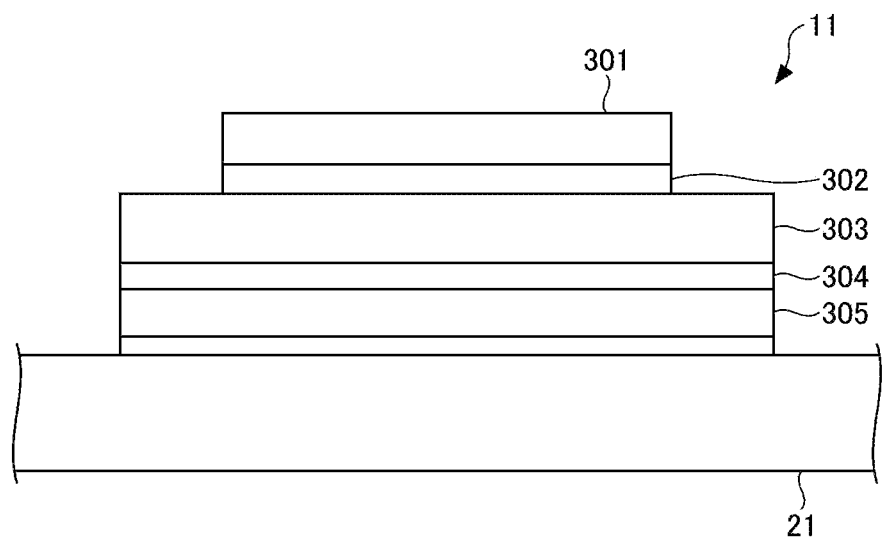
FIG. 3 is a diagram illustrating a laminated structure of a proximity sensor according to an embodiment.

FIG. 2 is an external perspective view of the proximity sensor 11 and the detection circuit 12 according to an embodiment. FIG. 3 is a diagram illustrating a laminated structure of the proximity sensor 11 according to an embodiment. In FIG. 2, the appearance of the front side (on the side with a detection electrode 302) of the proximity sensor 11 is illustrated.

The proximity sensor 11 illustrated in FIGS. 2 and 3 is a device capable of detecting the proximity state of an object (e.g., a person, etc.). As illustrated in FIG. 3, the proximity sensor 11 is generally thin and sheet-like and has a laminated structure in which a plurality of members are stacked. As illustrated in FIG. 3, the proximity sensor 11 is attached to the surface of the first robot arm 21 at a portion on the back side thereof (on the side with a guard electrode 304).

As illustrated in FIG. 3, the proximity sensor 11 includes an insulating film 301, the detection electrode 302, a spacer 303, the guard electrode 304, and an insulating film 305, in the stated order from the front side (the upper side in the figure) of the proximity sensor 11.

The insulating film 301 is a film-like member formed of an insulating material. The insulating film 301 protects the surface of the detection electrode 302. The insulating film 301 may be, for example, a PET film.

The detection electrode 302 is formed on the entire surface of the insulating film 301. Further, the detection electrode 302 is electrically conductive and is formed by printing conductive ink onto the insulating film 301 and firing the conductive ink. The detection electrode 302 detects the proximity state of an object to the proximity sensor 11. Specifically, as described above, the detection electrode 302 is driven by an AC (alternating-current) voltage applied from the detection circuit 12, and in accordance with the proximity state of an object to the detection electrode 302, the capacitance between the detection electrode 302 and the object (ground) changes, and in accordance with the change in the capacitance, the current value changes. The change in the current value is detected by the detection circuit 12. The detection electrode 302 may be a thin film conductor such as, for example, ITO (Indium Tin Oxide), IZO (Indium Zinc Oxide), or a metal film (e.g., a composite material of silver, copper, aluminum, and molybdenum).

The spacer 303 is a sheet-like member formed of an insulating material. The spacer 303 is provided between the detection electrode 302 and the guard electrode 304. The spacer 303 maintains a constant space between the detection electrode 302 and the guard electrode 304 and insulates the detection electrode 302 and the guard electrode 304 from each other. The spacer 303 can be, for example, a urethane foam. Also, although not illustrated, the top and the bottom of the spacer 303 are held by the insulating film 301 and the insulating film 305, respectively, by a double-sided tape or an adhesive.

The guard electrode 304 is formed on the entire surface of the insulating film 305. Further, the guard electrode 304 is electrically conductive and is formed by printing conductive ink onto the insulating film 305 and firing the conductive ink. The guard electrode 304 is provided on the bottom side of the detection electrode 302. The guard electrode 304 is formed so as to be superimposed above the detection electrode 302 in a planar view and is formed to have a greater area than the detection electrode 302 so that the outer periphery of the guard electrode 304 protrudes out from the detection electrode 302. The guard electrode 304 prevents the detection electrode 302 from being affected from the lower surface (the surface on the side of the first robot arm 21), by receiving an active shield signal having the same waveform as that applied to the detection electrode 302, applied from the detection circuit 12. Specifically, for example, the guard electrode 304 can prevent the capacitance at the detection electrode 302 from being affected by the capacitance with respect to the first robot arm 21, or prevent noise from the first robot arm 21 from entering the detection electrode 302, thereby increasing the detection accuracy of the detection electrode 302. The guard electrode 304 may be a thin film-like conductor such as, for example, ITO (Indium Tin Oxide), IZO (Indium Zinc Oxide), or a metal film (e.g., a composite material of silver, copper, aluminum, and molybdenum).

The insulating film 305 is a film-like member formed of an insulating material. The insulating film 305 protects the bottom surface of the guard electrode 304. The insulating film 305 can be, for example, a PET film.

(Configuration of the Shield Electrode 13)

Figure 4:
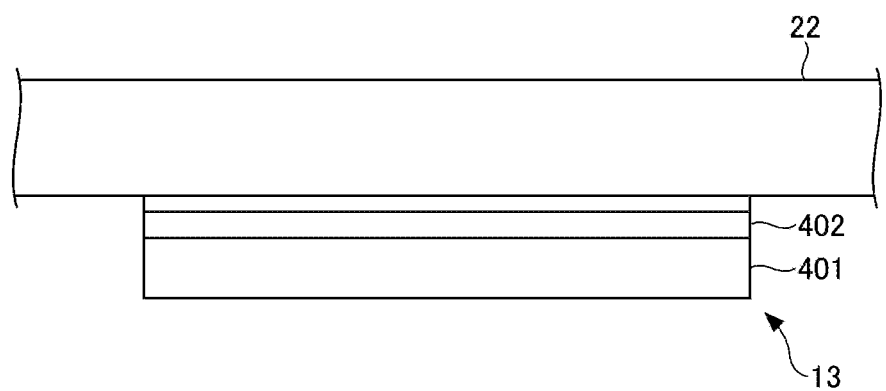
FIG. 4 is a diagram illustrating a laminated structure of a shield electrode according to an embodiment.

FIG. 4 illustrates a laminated structure of the shield electrode 13 according to an embodiment. The shield electrode 13 illustrated in FIG. 4 is a device that can cause the detection of the proximity of an object by the proximity sensor 11 to be non-detection (the shield electrode 13 can prevent the proximity sensor 11 from detecting the proximity of an object) (i.e., such that there is almost no change in the capacitance at the proximity sensor 11, which would be caused by the proximity of an object). As illustrated in FIG. 4, the shield electrode 13 is generally thin and sheet-like and has a laminated structure in which a plurality of members are stacked. As illustrated in FIG. 4, the shield electrode 13 is attached to the surface of the second robot arm 22 at a portion on the back side thereof (on the side with an electrode 402).

As illustrated in FIG. 4, the shield electrode 13 includes an insulating film 401 and the electrode 402, in the stated order from the surface side (the lower side in the figure) of the proximity sensor 11.

The insulating film 401 is a film-like member formed of an insulating material. The insulating film 401 protects the surface of the electrode 402. The insulating film 401 may be, for example, a PET film.

The electrode 402 is formed on the entire surface of the insulating film 401. Further, the electrode 402 is electrically conductive and is formed by printing a conductive ink onto the insulating film 401 and firing the conductive ink. The electrode 402 receives a shield signal from the robot arm shield circuit 14, so that even when the shield electrode 13 comes in proximity with the proximity sensor 11, the capacitance at the proximity sensor 11 does not appreciably change, so that the proximity sensor 11 does not detect any objects. That is, even when the second robot arm 22, on which the shield electrode 13 is mounted, comes in proximity with the first robot arm 21, the electrode 402 can prevent the second robot arm 22 from being mistakenly detected as an obstacle. The electrode 402 may be, for example, a thin film conductor such as ITO, IZO, a metal film, a thin film-like conductor, or the like.

(Circuit Configuration of the Proximity Detection System 10)

Figure 5:
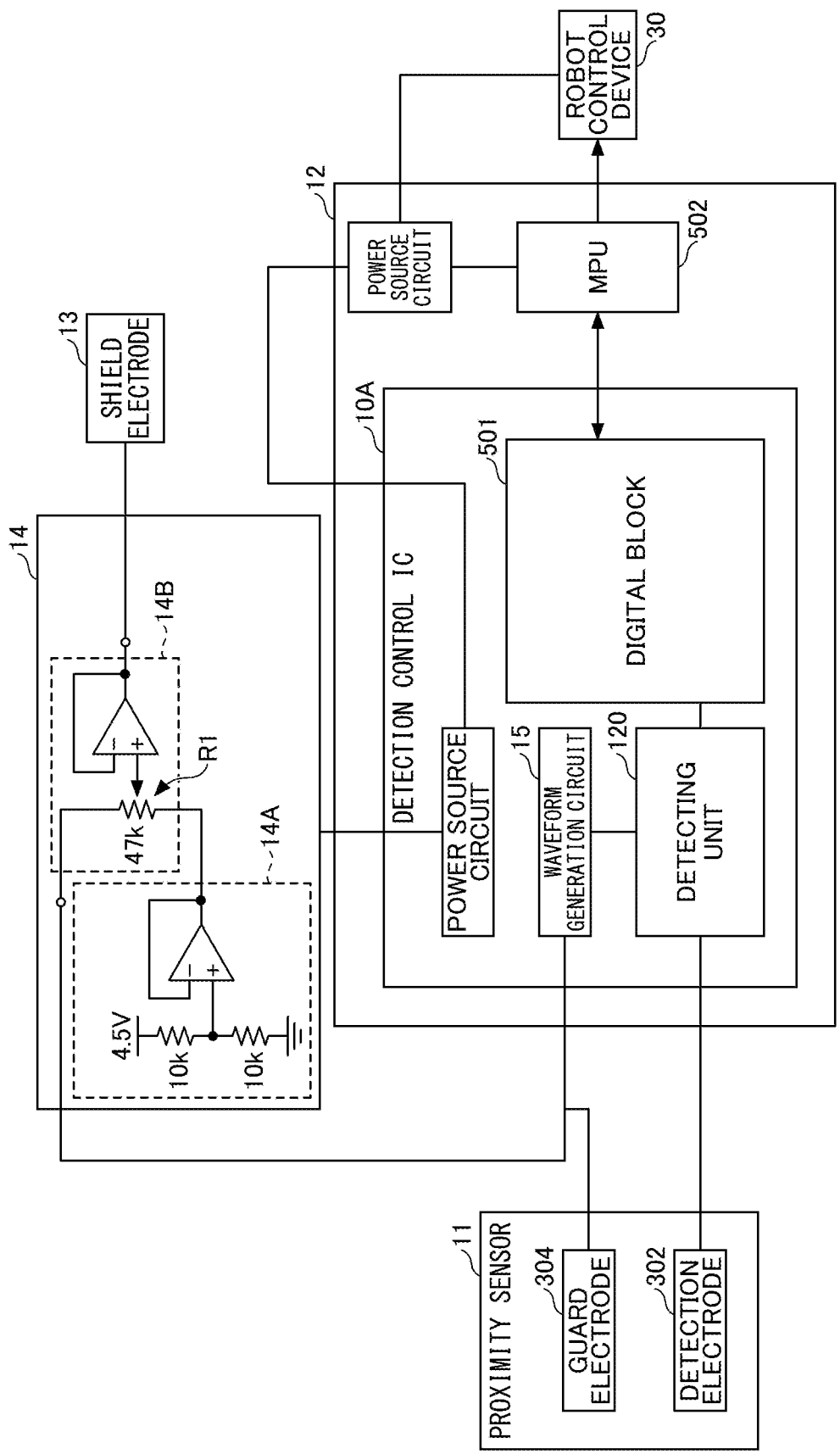
FIG. 5 is a diagram illustrating a circuit configuration of a proximity detection system according to an embodiment.

FIG. 5 is a diagram illustrating a circuit configuration of the proximity detection system 10 according to an embodiment. As illustrated in FIG. 5, the proximity detection system 10 includes a detection control IC (Integrated Circuit) 10A. The detection control IC 10A includes a detecting unit 120, a waveform generation circuit 15, and a digital block 501. The detecting unit 120 is connected to the detection electrode 302 of the proximity sensor 11. The detecting unit 120 detects the proximity state of an object to the proximity sensor 11, by measuring the current flowing through the detection electrode 302 and measuring the change in capacitance between the detection electrode 302 and an object (ground), such as a person. The digital block 501 is a block for converting the output signal from the detecting unit 120 into a digital signal, and outputs the digital signal to an MPU (microprocessor unit) 502. The MPU 502 determines whether a person has come into proximity, and outputs the determination result to the robot control device 30. The waveform generation circuit 15 is connected to the guard electrode 304, the robot arm shield circuit 14, and the detecting unit 120. The waveform generation circuit 15 generates an active shield signal and outputs the active shield signal to the guard electrode 304 and the robot arm shield circuit 14. The active shield signal is a signal having a waveform synchronized with a driving signal applied to the detection electrode 302 from the waveform generation circuit 15 via the detecting unit 120. The guard electrode 304 receives the active shield signal, thereby primarily preventing the detection electrode 302 from being affected by the robot surface in the present embodiment. It is preferable that the active shield signal is a sinusoidal wave that is resistant to high frequency noise radiation and conduction noise.

The robot arm shield circuit 14 receives the active shield signal output from the waveform generation circuit 15. The robot arm shield circuit 14 includes a midpoint potential forming circuit 14A and an amplitude adjustment circuit 14B. The midpoint potential forming circuit 14A forms the same potential as the voltage applied to the detecting unit 120 and includes a buffer circuit (a voltage follower circuit) to supply a stable voltage for generating a shield signal to the amplitude adjustment circuit 14B. The amplitude adjustment circuit 14B generates a shield signal by adjusting the amplitude of the active shield signal input to the robot arm shield circuit 14 and outputs the shield signal to the shield electrode 13. That is, the shield signal has the same frequency as the active shield signal and is different in amplitude from the active shield signal. Specifically, the amplitude adjustment circuit 14B includes a resistor R1 and determines the amplitude of the active shield signal based on the resistance value of the resistor R1 and outputs the amplitude to the shield electrode 13 via a buffer circuit (a voltage follower circuit). Accordingly, the resistor R1 used here has an appropriate resistance value so that the amplitude of the active shield signal becomes the appropriate amplitude which has been obtained in advance.

(Example of Difference Value of Capacitance that Occurs in the Proximity Sensor 11)

Figure 6:
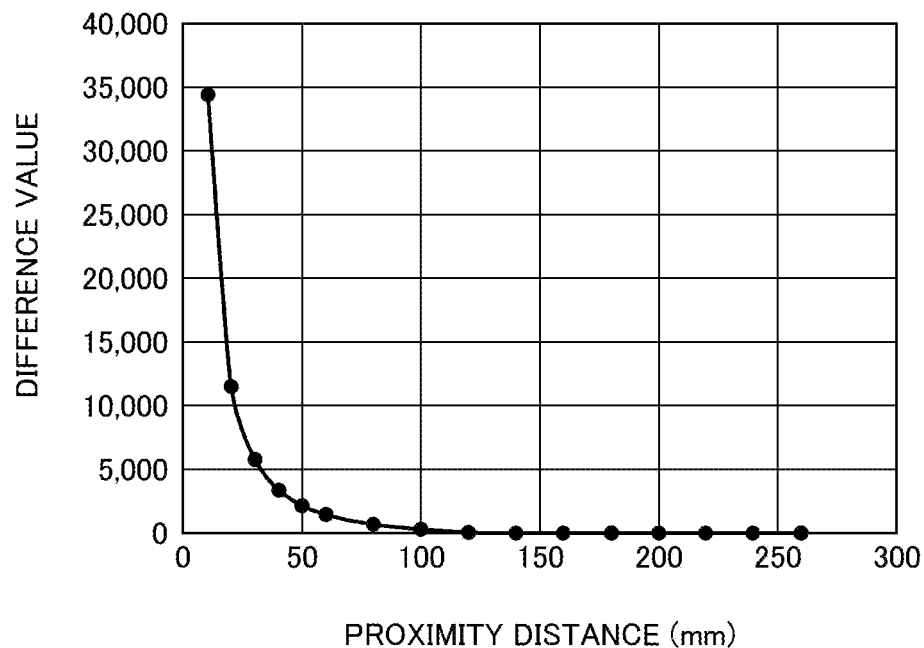
FIG. 6 is a graph illustrating an example of a difference value of the capacitance that occurs in the proximity sensor when a ground comes in proximity with a first robot arm.

FIG. 6 is a graph illustrating an example of a difference value of the capacitance that occurs in the proximity sensor 11 when a ground (e.g., an object that corresponds to a human body, the second robot arm 22 to which the shield electrode 13 is not mounted, or the like, and that is considered to be a conductor and connected to the ground) comes in proximity with the first robot arm 21. The reference value of the difference value is the value of the capacitance when there is no object in the surrounding area. In the graph of FIG. 6, the horizontal axis indicates the proximity distance of the ground to the first robot arm 21, and the vertical axis indicates the difference value of the capacitance that occurs in the proximity sensor 11. As illustrated in FIG. 6, in the proximity detection system 10 of the present embodiment, as the proximity distance of ground to the first robot arm 21 decreases, the capacitance value increases, so that the difference value of the capacitance that occurs in the proximity sensor 11 gradually increases.

Figure 7:
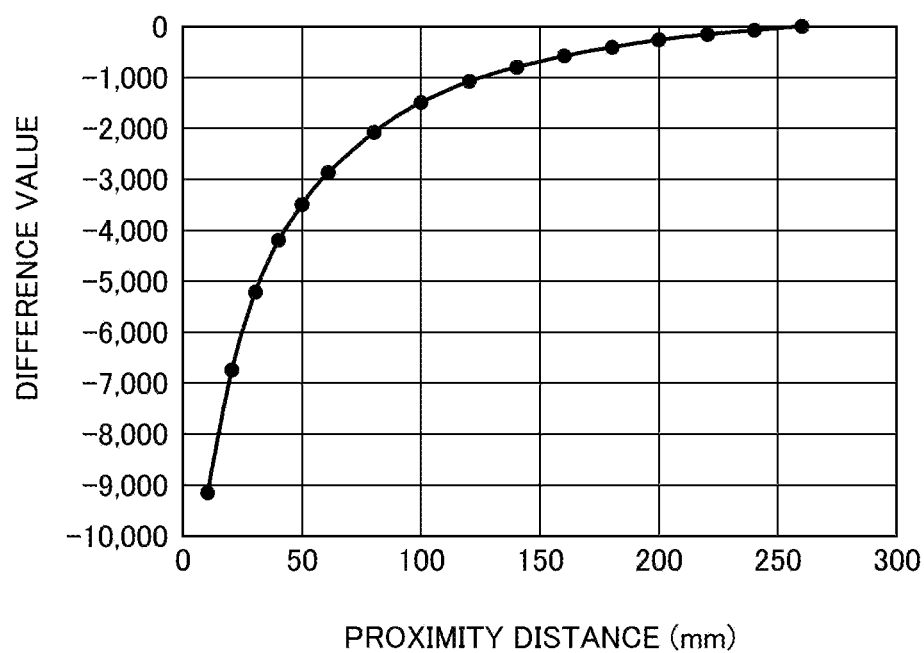
FIG. 7 is a graph illustrating an example of a difference value of the capacitance that occurs in the proximity sensor when a shield electrode comes in proximity with a first robot arm.

FIG. 7 is a graph illustrating an example of the difference value of the capacitance that occurs in the proximity sensor 11 when the shield electrode 13 driven by a shield signal comes in proximity with the first robot arm 21. The reference value of the difference value is the value of the capacitance when the shield electrode 13 is not present in the surrounding area. In the graph of FIG. 7, the horizontal axis indicates the proximity distance of the shield electrode 13 to the first robot arm 21, and the vertical axis indicates the difference value of the capacitance that occurs in the proximity sensor 11. FIG. 7 illustrates the characteristic of the difference value of the capacitance at the proximity sensor 11 when the amplitude of the shield signal applied to the shield electrode 13 is made to be the same as the amplitude of the active shield signal applied to the guard electrode 304 (i.e., the amplitude of the shield signal is not adjusted). On the back side of the detection electrode 302 of the proximity sensor 11, a capacitance does not occur due to the guard electrode 304, and, therefore, the back side of the detection electrode 302 does not affect the capacitance characteristic. On the other hand, on the front side of the detection electrode 302, a capacitance (floating capacitance) occurs between the detection electrode 302 and the ground when the shield electrode 13 is located at a distance. As illustrated in FIG. 7, in the proximity detection system 10 of the present embodiment, a signal similar to that applied to the detection electrode 302 is applied to the shield electrode 13, and, therefore, the difference in potential between the detection electrode 302 and the shield electrode 13 is reduced, so that the capacitance (floating capacitance) between the detection electrode 302 and the ground is reduced. Thus, in contrast to the graph illustrated in FIG. 6, as the proximity distance of the shield electrode 13 to the first robot arm 21 becomes short, the difference value of the capacitance that occurs in the proximity sensor 11 gradually becomes smaller.

(Example of Variation of Difference Value of Capacitance that Occurs in the Proximity Sensor 11)

Figure 8:
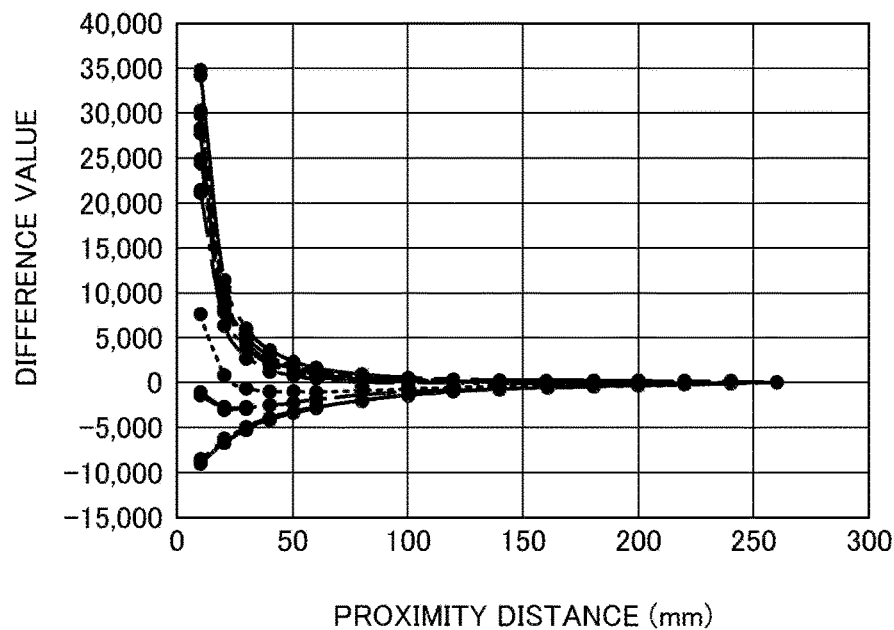
FIG. 8 is a graph illustrating an example of a difference value of the capacitance that occurs in the proximity sensor when a shield electrode comes in proximity with a first robot arm.

FIG. 8 is a graph illustrating an example of the variation of the difference value of the capacitance that occurs in the proximity sensor 11 when the shield electrode 13 comes in proximity with the first robot arm 21. The reference value of the difference value is the value of the capacitance when the shield electrode 13 is not present in the surrounding area. As illustrated in FIG. 8, in the proximity detection system 10 of the present embodiment, by adjusting the amplitude of the shield signal applied to the shield electrode 13, the difference value of the capacitance that occurs in the proximity sensor 11 when the shield electrode 13 comes in proximity with the first robot arm 21 can be varied. Specifically, by gradually decreasing the amplitude of the shield signal applied to the shield electrode 13, the difference value of the capacitance that occurs in the proximity sensor 11 can be gradually increased. That is, by decreasing the amplitude, the shield electrode 13 becomes similar to the ground, and, therefore, the same tendency as in FIG. 6 will occur. Conversely, by gradually increasing the amplitude of the shield signal applied to the shield electrode 13, the difference value of the capacitance that occurs in the proximity sensor 11 can be gradually decreased, and, therefore, the same tendency as in FIG. 7 will occur.

Therefore, in the proximity detection system 10 of the present embodiment, various requirements can be addressed by adjusting the amplitude of the shield signal applied to the shield electrode 13 and adjusting the difference value of the capacitance that occurs in the proximity sensor 11 when the shield electrode 13 comes in proximity with the first robot arm 21.

(Example of Adjustment of Difference Value of Capacitance that Occurs in the Proximity Sensor 11)

Figure 9:
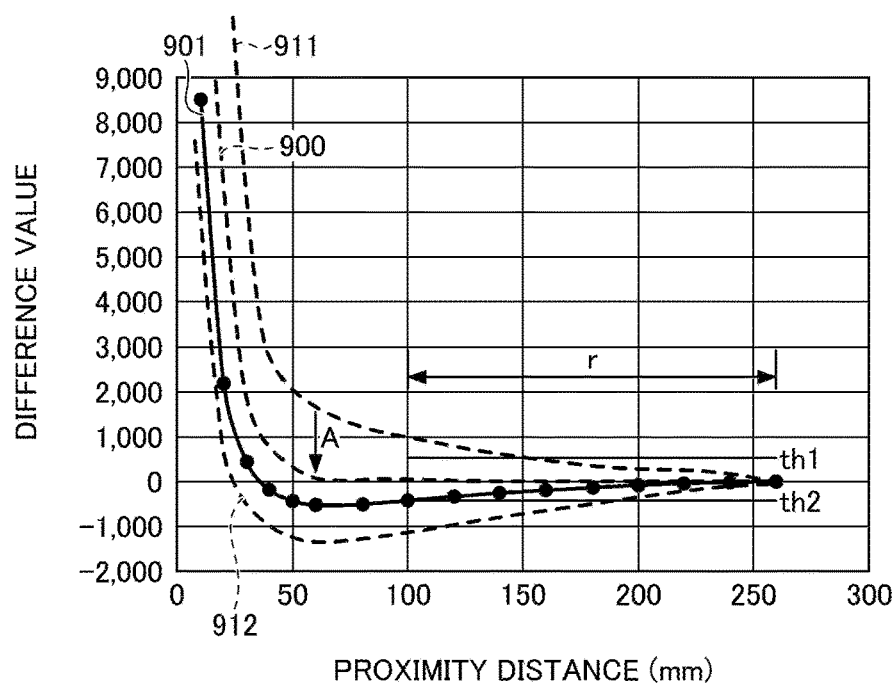
FIG. 9 is a graph illustrating an example of adjusting a difference value of the capacitance that occurs in the proximity sensor when the shield electrode comes in proximity with the first robot arm.

FIG. 9 is a graph illustrating an example of adjustment of the difference value of the capacitance that occurs in the proximity sensor 11 when the shield electrode 13 comes in proximity with the first robot arm 21, and for the sake of explanation of the graph of FIG. 8, FIG. 9 includes partially extracted data from FIG. 8.

For example, in an example in which an amplitude represented by a difference value characteristic 900 of FIG. 9 is applied to the shield electrode 13, in a proximity distance range r (100 mm to 260 mm), even when the second robot arm 22 comes in proximity with the first robot arm 21, the difference value of the capacitance that occurs in the proximity sensor 11 (hereinafter simply referred to as the "difference value") is substantially zero, which is an ideal difference value. Therefore, the influence caused by the proximity of the second robot arm 22 can be disregarded. Thus, even if the second robot arm 22 and a human body, etc., come in proximity with the proximity sensor 11 at the same time, by measuring the difference value, it is possible to detect the proximity of the human body, etc.

In the example illustrated in FIG. 9, an upper limit threshold value th1 of the difference value is defined. The upper limit threshold value th1 is a boundary value for determining whether the first robot arm 21 and an obstacle such as a person have come in proximity with each other. When the difference value measured by the detecting unit 120 is converted into a digital signal by the digital block 501 and exceeds the upper limit threshold value th1 in the MPU 502, it is determined that the first robot arm 21 and an obstacle such as a person have come in proximity with each other.

For example, according to a difference value characteristic 911 illustrated in FIG. 9, the difference value exceeds the upper limit threshold value th1 in the proximity distance range r. In this case, by adjusting the resistance value of the resistor R1 provided in the amplitude adjustment circuit 14B to increase the amplitude of the shield signal applied to the shield electrode 13, the difference value characteristic 911 can be brought closer to the ideal difference value characteristic 900, as illustrated by the arrow A in the figure. Note that even in the case of the difference value characteristic 900, when the proximity distance becomes 40 mm or less, erroneous detection will be performed; however, this can be addressed by setting a mechanical configuration to prevent further proximity.

Further, FIG. 9 illustrates an example in which a lower limit threshold value th2 of the difference value is defined. The lower limit threshold value th2 is used to determine whether the second robot arm 22 has come in proximity with the first robot arm 21. That is, if the amplitude is adjusted so that the difference value falls below the predetermined lower limit threshold value th2 at a predetermined proximity distance, as the difference value characteristics 901 and 912 illustrated in FIG. 9, it can be determined whether the second robot arm 22 has come into proximity. However, in this case, when the shield electrode 13 and the human body, etc., have come in proximity with the proximity sensor 11 at the same time, the output becomes smaller as compared to the case where only a human body, etc., has come in proximity with the proximity sensor 11. Therefore, it is necessary to set the upper limit threshold value th1 by which it is determined that a human body, etc., has come into proximity, to be low.

In the actual setting, the amplitude and threshold values are set appropriately based on the difference value of the proximity sensor 11 when only the shield electrode 13 of FIG. 9 is in proximity with the proximity sensor 11, the difference value of the proximity sensor 11 when only the human body, etc., of FIG. 6 is in proximity with the proximity sensor 11, the difference value when both the shield electrode 13 and the human body, etc., of FIG. 9 and FIG. 6 are in proximity with the proximity sensor 11, and what is to be determined in what case, etc.

Further, the relationship between the amplitude of the shield signal and the difference value of the capacitance that occurs in the proximity sensor 11 varies depending on the product specification (e.g., the size of the shield electrode 13, etc.). Therefore, it is preferable to derive an appropriate amplitude according to the specification of the product as the amplitude of the shield signal by simulation or the like.

As described above, the proximity detection system 10 according to an embodiment includes the proximity sensor 11 that is a capacitive sensor, which is mounted on the first robot arm 21 of the robot 20 (an example of "a mounting position" that is any position on a robot), for detecting the proximity of an object to the first robot arm 21; and the robot arm shield circuit 14 for applying, to the second robot arm 22 of the robot 20 (an example of "another position of the robot other than the mounting position"), a shield signal capable of preventing the proximity sensor 11 from detecting the proximity of the second robot arm. Accordingly, the proximity detection system 10 according to an embodiment can prevent the second robot arm 22 from being detected by the proximity sensor 11 even when the second robot arm 22 is proximate to the first robot arm 21. Thus, by the proximity detection system 10 according to an embodiment, the detection accuracy of an obstacle coming in proximity with the robot 20 can be increased.

The proximity detection system 10 according to an embodiment further includes the shield electrode 13 provided on the second robot arm 22, and the robot arm shield circuit 14 applies a shield signal to the shield electrode 13. That is, by the proximity detection system 10 according to an embodiment, any position of the robot 20 can be easily set to be a target position for preventing erroneous detections by the sensor, by providing a shield electrode to the corresponding position.

Further, in the proximity detection system 10 according to an embodiment, the robot arm shield circuit 14 generates a shield signal by adjusting the amplitude of an input signal having a waveform synchronized with a driving signal applied to the proximity sensor 11. That is, the proximity detection system 10 according to an embodiment can use the driving signal applied to the proximity sensor 11 to generate a shield signal, and thus can generate a shield signal with a relatively simple configuration.

Further, in the proximity detection system 10 according to an embodiment, the proximity sensor 11 includes the detection electrode 302 for detecting the proximity of an object to the robot 20 and the guard electrode 304 provided so as to be superimposed above the detection electrode 302, and the robot arm shield circuit 14 generates a shield signal by using an active shield signal applied to the guard electrode 304 as an input signal and adjusting the amplitude of the input signal. Accordingly, in the proximity detection system 10 according to an embodiment, the guard electrode 304 is provided in the proximity sensor 11, so that the detection accuracy by the detection electrode 302 can be increased, and a shield signal can be generated by using the active shield signal applied to the guard electrode 304. Therefore, the shield signal can be generated by a relatively simple configuration.

Further, in the proximity detection system 10 according to an embodiment, the robot arm shield circuit 14 generates a shield signal by adjusting the amplitude of an input active shield signal such that the difference value of the capacitance detected by the proximity sensor 11 does not exceed the predetermined upper limit threshold value th1 in the predetermined proximity distance range r with respect to the proximity sensor 11, when the second robot arm 22 comes in proximity with the proximity sensor 11. Accordingly, the proximity detection system 10 according to an embodiment can prevent the second robot arm 22 from being detected by the proximity sensor 11 even when the second robot arm 22 has come in proximity with the first robot arm 21.

While an embodiment of the present invention has been described in detail above, the present invention is not limited to these embodiments, and various modifications or variations are possible within the scope of the invention as defined in the appended claims.

For example, in the above described embodiment, one proximity sensor 11 is provided to the robot 20, but the embodiment is not limited thereto. A plurality of the proximity sensors 11 may be provided to the robot 20.

For example, in the above described embodiment, one shield electrode 13 is provided for the robot 20, but the embodiment is not limited thereto. A plurality of the shield electrodes 13 may be provided for the robot 20.

For example, in the above-described embodiment, the second robot arm 22 is provided with the shield electrode 13 and a shield signal is applied to the shield electrode 13, but the embodiment is not limited thereto. The shield electrode 13 may not be provided to the second robot arm 22, and a shield signal may be applied directly to a conductive portion (for example, a metal surface) of the second robot arm 22.

Further, in the above-described embodiment, the proximity sensor 11 is provided at a movable portion, that is, the first robot arm 21, in order to prevent the proximity of the first robot arm 21 to human body or the like from being equal to or more than a predetermined value, but the embodiment is not limited thereto. The proximity sensor 11 may be provided at a fixed portion to stop the operation of the robot 20 when a human body or the like comes into proximity within a predetermined distance.

Further, in the embodiment described above, the shield electrode 13 is provided at the second robot arm 22 which is a movable portion, but the shield electrode 13 may be provided at any portion of the robot 20 which may come in proximity with the proximity sensor 11. For example, when the proximity sensor 11 is provided at a movable portion, the shield electrode 13 may be mounted at both a movable portion and a fixed portion, and when the proximity sensor 11 is provided at a fixed portion, the shield electrode 13 may be mounted at a movable portion.

According to an aspect of the present invention, the detection accuracy of the proximity between a robot and an obstacle can be increased because another position of the robot other than a position where a sensor is mounted, can be prevented from being mistakenly detected as an obstacle.

Although the embodiments have been described in detail, the present invention is not limited to specific embodiments, and various modifications and changes can be made within the scope set forth in the appended claims.

What is claimed is:

1. A proximity detection system comprising;
a first arm part;
a second arm part that is rotatably mounted on the first arm part;

a proximity sensor that is mounted only on the first arm part, said proximity sensor being a capacitive sensor mounted only on a mounting position on a robot, said mounting position being located so as to face the second arm part when the second arm part are rotated toward the first arm part, the proximity sensor being configured to detect first proximity between the mounting position and an object by determining that a difference value of a capacitance at the proximity sensor exceeds a first threshold value, and second proximity between the mounting position and the second arm part by determining that the difference value of the capacitance at the proximity sensor falls below a second threshold value; and a shield signal output unit configured to apply a shield signal to another position of the second arm part, said another position of the robot being configured to come into proximity with the proximity sensor, wherein the shield signal output unit, generates the shield signal by adjusting an amplitude of an input signal having a waveform synchronized with a driving signal applied to the proximity sensor, wherein the shield signal output unit generates the shield signal by adjusting the amplitude of the input signal such that a difference value of a capacitance, detected by the proximity sensor does not exceed the first threshold value when the another position comes in proximity with the proximity sensor, in a predetermined proximity distance range with respect to the proximity sensor, and wherein the first threshold value is a positive value and the second threshold value is a negative value.

2. The proximity detection system according to claim 1, further comprising:

a shield electrode, wherein the shield signal output unit applies the shield signal to the shield electrode.

3. The proximity detection system according to claim 1, wherein the proximity sensor includes:

a detection electrode configured to detect proximity of the object to the robot, and a guard electrode provided so as to be superimposed above the detection electrode, wherein the shield signal output unit generates the shield signal by adjusting the amplitude of the input signal, by using an active shield signal applied to the guard electrode as the input signal.

4. The proximity detection system according to claim 1, wherein the shield electrode is provided on the second arm part at a position of the second arm part that corresponds to the proximity sensor when the second arm part are rotated toward the first arm part.

* * * * *